United States Patent
Hagihara et al.

(10) Patent No.: US 12,093,204 B2
(45) Date of Patent: Sep. 17, 2024

(54) SerDes INTERFACE CIRCUIT AND CONTROL DEVICE

(71) Applicant: Fanuc Corporation, Yamanashi (JP)

(72) Inventors: Kei Hagihara, Yamanashi (JP); Tomomasa Nakama, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 30 days.

(21) Appl. No.: 17/793,723

(22) PCT Filed: Feb. 16, 2021

(86) PCT No.: PCT/JP2021/005703
§ 371 (c)(1),
(2) Date: Jul. 19, 2022

(87) PCT Pub. No.: WO2021/166906
PCT Pub. Date: Aug. 26, 2021

(65) Prior Publication Data
US 2023/0066398 A1    Mar. 2, 2023

(30) Foreign Application Priority Data
Feb. 21, 2020 (JP) ................. 2020-027946

(51) Int. Cl.
*G06F 13/42* (2006.01)

(52) U.S. Cl.
CPC .. *G06F 13/4282* (2013.01); *G06F 2213/0002* (2013.01)

(58) Field of Classification Search
CPC ......... G06F 13/4282; G06F 2213/0002; G06F 13/4018; H03M 9/00
See application file for complete search history.

(56) References Cited

U.S. PATENT DOCUMENTS 5,587,709 A * 12/1996 Jeong ................ H03M 9/00
341/100
7,091,890 B1 * 8/2006 Sasaki ................ H03M 9/00
341/59

(Continued)

FOREIGN PATENT DOCUMENTS

JP    2009109488 A    5/2009
JP    2010535453 A    11/2010

(Continued)

OTHER PUBLICATIONS

International Search Report and Written Opinion for International Application No. PCT/JP2021/005703, dated Apr. 27, 2021, 7 pages.

*Primary Examiner* — Farley Abad
(74) *Attorney, Agent, or Firm* — Buchanan Ingersoll & Rooney PC

(57) ABSTRACT

The present invention provides a SerDes interface circuit and a control device which make it possible to use the same SerDes to perform data transfer of different communication rates. The present invention includes: a FIFO that inputs a first clock of a first frequency, first transmission data based on the first clock, and a second clock of a second frequency which is different from the first frequency, and that outputs the first transmission data on the basis of the second clock in the order of input; a flipflop that fetches and holds the FIFO output on the basis of the second clock; and an output state machine operating with the second clock that inputs the FIFO output and the flipflop output, and generates parallel data in which the same data corresponding to the first transmission data is consecutive.

13 Claims, 10 Drawing Sheets

(56) References Cited

U.S. PATENT DOCUMENTS

| | | | |
|---|---|---|---|
| 7,983,374 B2 * | 7/2011 | Lei | H03M 9/00 |
| | | | 713/400 |
| 2006/0268624 A1 * | 11/2006 | Jang | G11C 29/12015 |
| | | | 365/194 |
| 2008/0101238 A1 * | 5/2008 | Dietrich | G11C 7/1078 |
| | | | 370/235 |
| 2009/0037621 A1 | 2/2009 | Boomer et al. | |
| 2009/0109071 A1 | 4/2009 | Hazzard et al. | |
| 2011/0222866 A1 | 9/2011 | Mashimo et al. | |
| 2016/0094333 A1 | 3/2016 | Nakama | |
| 2017/0139872 A1 | 5/2017 | Ladd et al. | |
| 2018/0300282 A1 * | 10/2018 | Vertenten | G06F 13/4282 |
| 2019/0245637 A1 | 8/2019 | Toyoda et al. | |

FOREIGN PATENT DOCUMENTS

| | | | | |
|---|---|---|---|---|
| JP | 2011193068 A | 9/2011 | | |
| JP | 2016072772 A | 5/2016 | | |
| JP | 2018533791 A | 11/2018 | | |
| JP | 2019140489 A | 8/2019 | | |
| WO | WO-2004102791 A1 * | 11/2004 | | H03F 1/523 |

* cited by examiner

FIG. 2
(a)
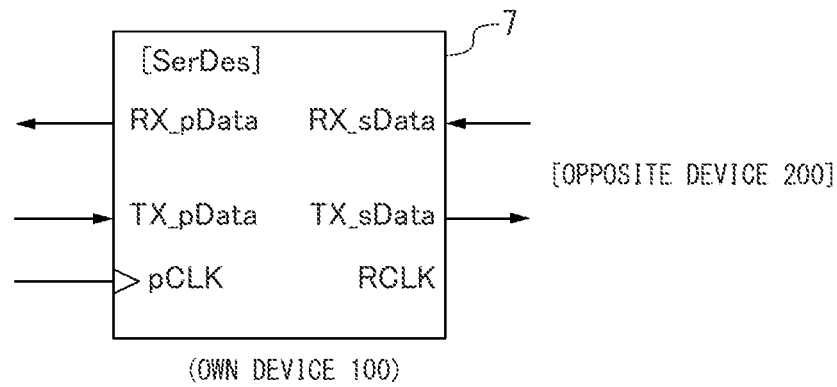
(b)
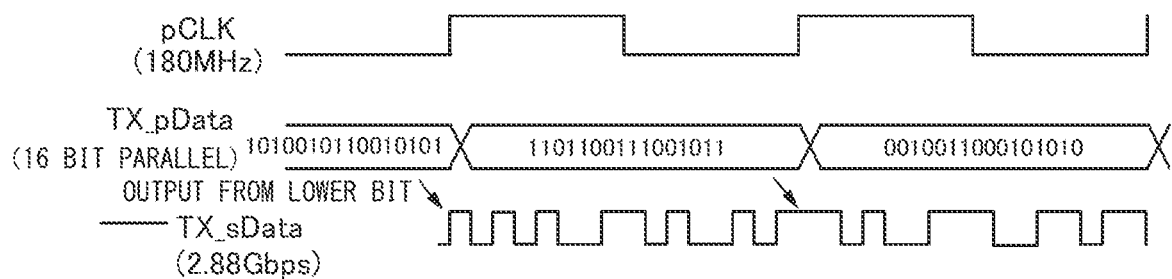
(c)
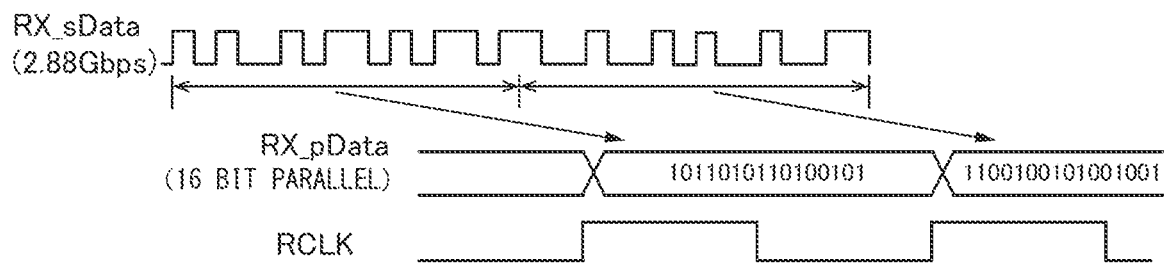

FIG. 10

[FIFO WITH OUTPUT NUMBER CONTROL FUNCTION]

WHEN Out_num = 0
NOTHING IS OUTPUT

WHEN Out_num = 1

(a) (FIFO NUMBER IS OUTPUT ORDER)

| | | 8 | 7 | 6 | 5 | 4 | 3 | 2 | 1 |

OUTPUT TO O2, AND NOTHING IS OUTPUT TO O1

WHEN Out_num = 2

(b) (FIFO NUMBER IS OUTPUT ORDER)

| | | 8 | 7 | 6 | 5 | 4 | 3 | 2 | 1 |

OUTPUT TO O1
OUTPUT TO O2

SerDes INTERFACE CIRCUIT AND CONTROL DEVICE

CROSS REFERENCE TO RELATED APPLICATIONS

This is the U.S. National Phase application of PCT/JP2021/005703, filed Feb. 16, 2021, which claims priority to Japanese Patent Application No. 2020-027946, filed Feb. 21, 2020, the disclosures of these applications being incorporated herein by reference in their entireties for all purposes.

FIELD OF THE INVENTION

Embodiments discussed herein relate to a SerDes interface circuit and a control device.

BACKGROUND OF THE INVENTION

In recent years, computerized numerical control (CNC: Computerized Numerical Controller) devices for controlling machine tools become faster with the implementation of various functions. For example, in data communication between a machine tool to be controlled and a CNC, a SerDes (SERializer/DESerializer) capable of high-speed data transmission of a large capacity has been used.

The SerDes is, for example, used in one device to convert parallel data into serial data and transmit the serial data to the other device, and in the other device, the reception serial data is convert into parallel data again and the converted parallel data is used. Therefore, the SerDes enables high-speed data communication without considering a skew caused by wiring lengths or floating capacitances for each bit in parallel communication, and with reducing the number of wirings or terminals.

By the way, conventionally, various proposals regarding data communication using a SerDes have been made.

PATENT LITERATURE

PTL1: Japanese Laid-open Patent Publication No. 2019-140489
PTL2: Japanese Laid-open Patent Publication No. 2009-109488
PTL3: Japanese Laid-open Patent Publication No. 2011-193068
PTL4: Japanese Laid-open Patent Publication No. 2016-072772

SUMMARY OF THE INVENTION

As described above, the SerDes has been used in various fields, because it is capable of high-speed data communication with a large capacity. This SerDes can not be used at a lower communication rate than a lower limit of the SerDes, because a communication rate range in which communication is possible are determined by, for example, a manufacturer or technology of an ASIC (Application Specific Integrated Circuit). Therefore, it is difficult to perform communication by different models (including devices, circuit blocks, etc.) of different communication rates using the same SerDes.

Further, in recent years, several data of different specifications (for example, several data of different communication rates (operation clocks)) have been used in one device. Therefore, for example, in one device (own device), it is required to convert data of different communication rates into serial data of a predetermined communication rate using the same (one) SerDes, and transmit the converted serial data to the other device (opposite device). Note that, in the opposite device, the transmitted serial data is processed by using a SerDes or another communication interface.

Specifically, for example, in the case where the own device is a CNC, it is required to convert both 16-bit parallel data operating with a clock of 180 MHz and a 1-bit signal operating with a clock of 160 MHz into a serial data with a communication rate of 2.88 Gbps by using the same SerDes, and to transmit the serial data to the opposite device (for example, a motor amplifier for controlling a servo motor of a machine tool). Note that these devices are not limited to a CNC and a machine tool, but are possible to apply, for example, a robot controller as an own device and an industrial robot or a collaborative robot controlled by the robot controller as an opposite device.

Further, the 16-bit parallel data of 180 MHz and the 1-bit signal of 160 MHz are merely examples, and the clock frequency such as 180 MHz or 160 MHz may be changed as appropriate, and the 16-bit parallel data is not also limited to 16 bits. In addition, the 1-bit signal of 160 MHz is also 1 bit for the sake of brevity, but it may be possible to apply a plurality of bits of 32 bits, 64 bits, etc. may be used as the parallel data.

An object of the present invention is to provide a SerDes interface circuit and a control device capable of performing data transmission of different communication rates by using the same SerDes.

According to an embodiment of the present invention, there is provided a SerDes interface circuit including a FIFO configured to input a first clock of a first frequency, first transmission data operating with the first clock and a second clock of a second frequency different from the first frequency, and configured to output the first transmission data operating with the second clock in an input order; a flip-flop configured to fetch and hold an output of the FIFO operating with the second clock; and an output state machine operating with the second clock configured to input the output of the FIFO and an output of the flip-flop, and configured to generate parallel data containing consecutive same data corresponding to the first transmission data.

According to embodiments of a SerDes interface circuit and a control device disclosed herein, it is possible to enable to perform data transmission of different communication rates by using the same SerDes.

The objects and effects of the present invention will be recognized and obtained by using the components and combinations pointed out in the claims. Both the general description described above and the detailed description below are exemplary and descriptive and do not limit the invention described in the claims.

BRIEF DESCRIPTION OF DRAWINGS

FIG. 2 is a diagram for explaining an example of a SerDes in the control device depicted in FIG. 1.

FIG. 10 is a diagram for explaining a FIFO with an output number control function in the SerDes interface circuit depicted in FIG. 9.

DETAILED DESCRIPTION OF EMBODIMENTS OF THE INVENTION

Figure 1:
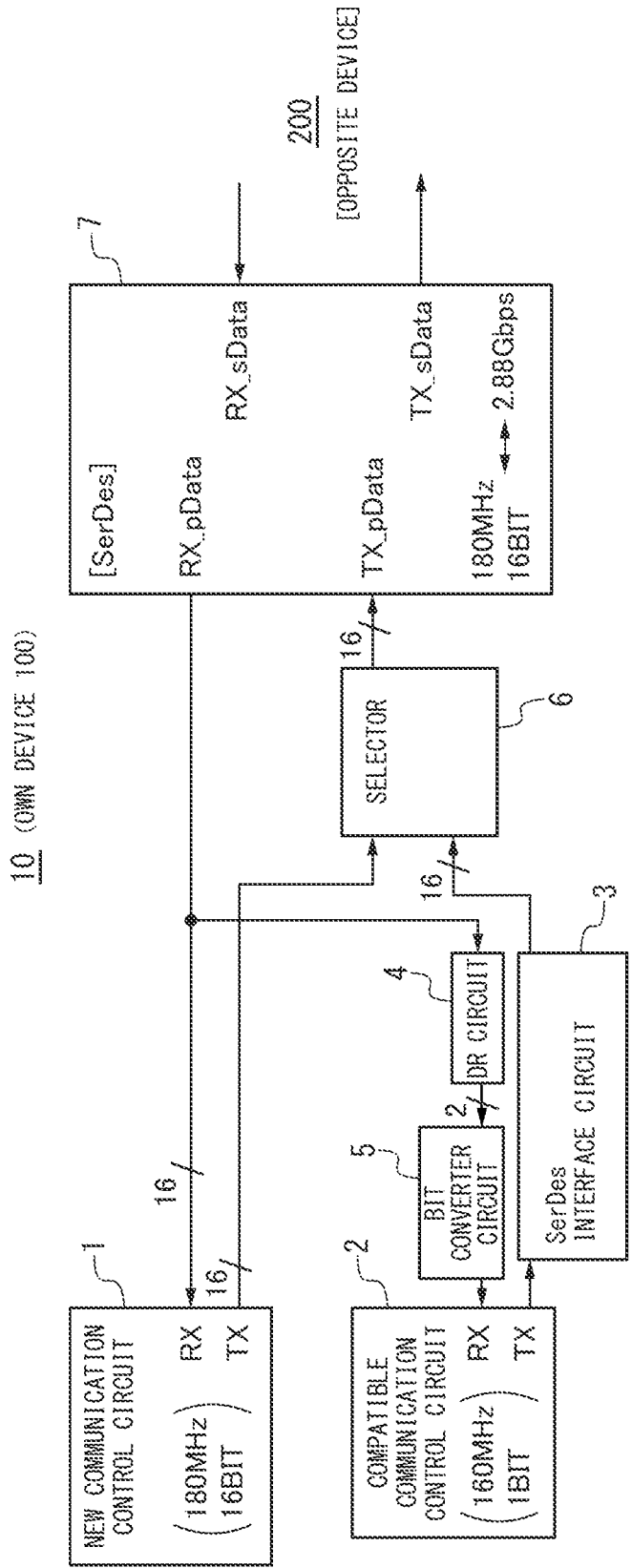
FIG. 1 is a block diagram depicting an embodiment of a control device according to the present invention.

Hereinafter, embodiments of a SerDes interface circuit and a control device according to the present invention will be described in detail with reference to the accompanying drawings. FIG. 1 is a block diagram depicting an embodiment of a control device according to the present invention.

As depicted in FIG. 1, a control device 10 of the present embodiment includes a new communication control circuit 1, a compatible communication control circuit 2, a SerDes interface circuit 3, a data recovery (Data Recovery: DR) circuit 4, a bit converter circuit 5, a selector 6, and a SerDes (SERializer/DESerializer) 7.

The control device 10 converts, for example, 16-bit parallel data of 180 MHz (16-bit parallel data operating with a clock with a frequency of 180 MHz: second transmission data) via the new communication control circuit 1, and a 1-bit signal of 160 MHz (1-bit signal operating with a clock with a frequency of 160 MHz: first transmission data) via the compatible communication control circuit 2 into serial data with a communication rate of 2.88 Gbps (bits/second) by the SerDes 7, and communicated the serial data to an opposite device (device on the other side of communication) 200.

For example, a SerDes is also provided in the opposite device 200, and serial data of 2.88 Gbps transmitted from the control device 10 (own device 100) may be converted into parallel data and the parallel data may be used in the opposite device 200. Specifically, the serial data of 2.88 Gbps may be converted into 16-bit parallel data of 180 MHz and a signal of 160 MHz, and may be input to a circuit controlled by 16-bit parallel data of 180 MHz and a circuit controlled by a signal of 160 MHz.

Alternatively, the transmitted serial data may be processed by using another communication interface circuit without providing a SerDes on the opposite device 200. Note that, as described above, the signal of 160 MHz via the compatible communication control circuit 2 is explained as the 1-bit signal so as to simplify the description, but the signal may also possible as parallel data of a plurality of bits.

Here, examples of the own device 100 may include various control devices such as a CNC and a robot controller, and examples of the opposing device 200 may include various machine tools controlled by a CNC, a device such as an industrial robot and a collaborative robot (or a motor amplifier for controlling an electric motor provided in the machine tool or the robot), but are not limited thereto.

The SerDes interface circuit 3 inputs a 1-bit signal (first transmission data) of 160 MHz from the compatible communication control circuit 2, converts it into a parallel signal operating with a clock of 180 MHz containing logical value corresponding to the first transmission data, and outputs the converted parallel signal. The selector 6 inputs 16-bit parallel data (second transmission data) of 180 MHz from the new communication control circuit 1 and 16-bit parallel data of 180 MHz from the SerDes interface circuit 3, selects one of them and outputs it to a parallel data input (TX_pData) for transmission of the SerDes 7.

FIG. 2 is a diagram for explaining an example of a SerDes in the control device depicted in FIG. 1. Here, FIG. 2(*a*) is a block diagram depicting input and output data of the SerDes 7, and FIG. 2(*b*) is a diagram for explaining a data transmission process (parallel to serial conversion process) of the SerDes 7, and FIG. 2(*c*) is a diagram for explaining a data reception process (serial to parallel conversion process) of the SerDes 7. Note that the SerDes is used particularly in the case of serial connection between parallel interfaces in a high-speed interface, but a general SerDes may be applied as the SerDes 7 of the control device 10 in the present embodiment.

In FIG. 2(*a*), a reference sign TX_pData denotes transmission parallel data (for example, 16-bit transmission parallel data operating with a clock of 180 MHz: and an input of the transmission parallel data) transmitted from an own device (one side device provided with the control device 10) 100 to an opposite device 200, and TX_sData denotes transmission serial data (for example, transmission serial data with a communication rate of 2.88 Gbps: and an output of the transmission serial data) which is converted from the transmission parallel data TX_pData and transmitted to the opposite device 200.

Further, in FIG. 2(*a*), a reference sign RX_sData denotes reception serial data (for example, reception serial data with a communication rate of 2.88 Gbps: and an input of the reception serial data) transmitted from the opposite device 200, and RX_pData denotes reception parallel data (for example, 16-bit reception parallel data operating with a clock of 180 MHz: and an output of the reception parallel data) converted from the reception serial data Rx_sdata to parallel data. In addition, pCLK denotes a clock of the transmission parallel data TX_pData (for example, a clock of 180 MHz: and an input of a clock of the transmission parallel data), and RCLK denotes a recovery clock (and an output of the recovery clock) recovered from the reception serial data received by a CDR (Clock Data Recovery).

First, as depicted in FIG. 2(*b*), when transmitting data, the SerDes 7, for example, converts 16-bit transmission parallel data TX_pData operating with the pCLK of 180 MHz into serial data to output from a lower bit, that is, converts the 16-bit transmission parallel data TX_pData into transmission serial data TX_pData with a communication rate of 2.88 Gbps, based on 180 MHz×16 bits, and outputs the transmission serial data TX_pData to the opposite device 200. Next, as depicted in FIG. 2(*c*), when receiving data, the SerDes 7 receives reception serial data RX_sData with a communication rate of 2.88 Gbps from the opposite device 200, converts the reception serial data RX_sData into 16-bit reception parallel data RX_pData, and outputs the 16-bit reception parallel data RX_pData.

In this way, in the SerDes 7, when assuming a frequency of an operation clock to X (for example, 180 MHz) and a number of bits of the parallel data to Y (for example, 16 bits), a communication rate Z of the serial data may be represented by Z=X×Y [bps] (for example, 180 MHz×16 bits=2.88 Gbps).

Figure 3:
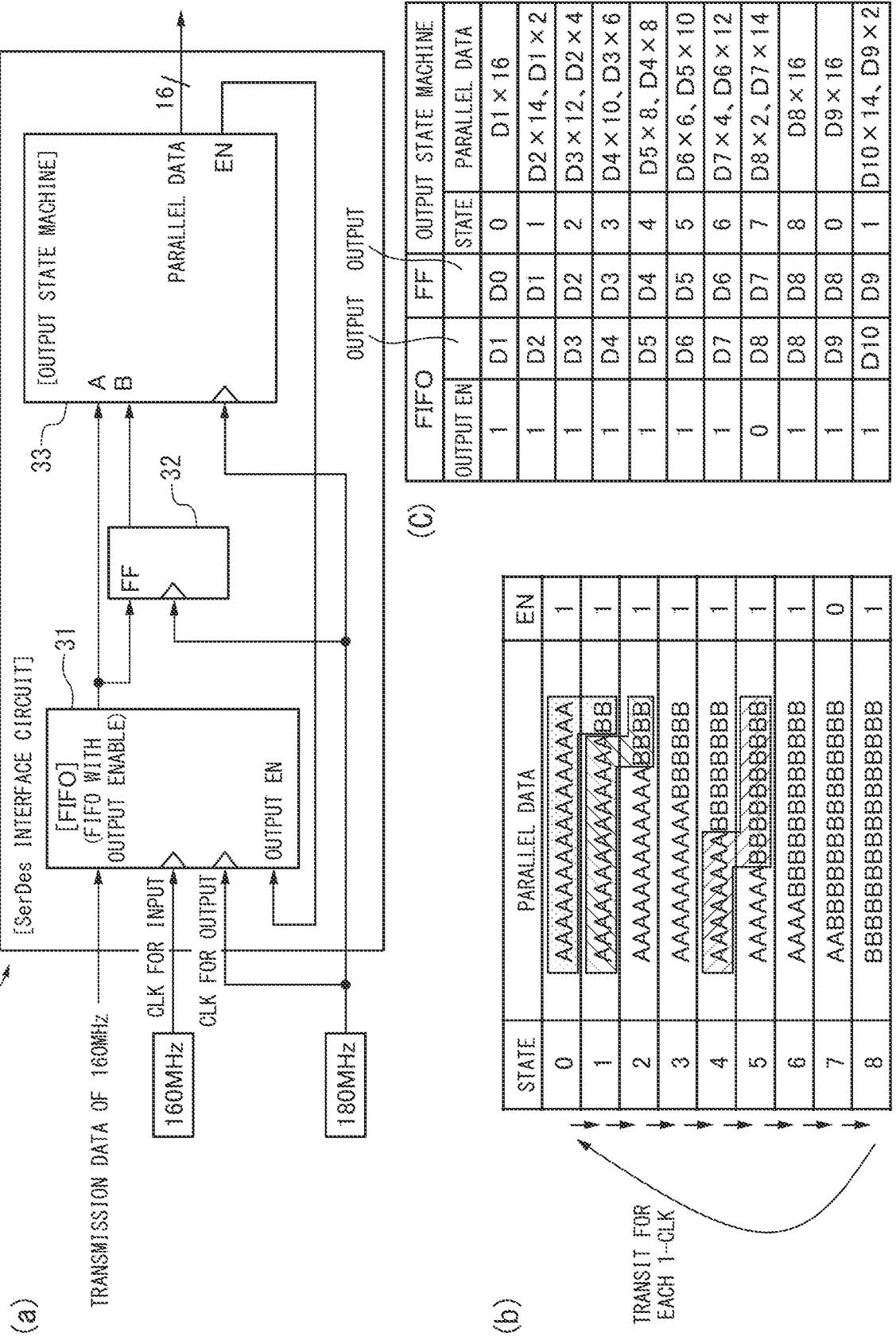
FIG. 3 is a diagram for explaining a first embodiment of a SerDes interface circuit in the control device depicted in FIG. 1.

FIG. 3 is a diagram for explaining a first embodiment of a SerDes interface circuit in the control device depicted in FIG. 1. Here, FIG. 3(*a*) is a block diagram depicting the first embodiment of the SerDes interface circuit, and FIG. 3(*b*) and FIG. 3(*c*) are diagrams for explaining operations of an output state machine in the SerDes interface circuit depicted in FIG. 3(a). As depicted in FIG. 3(a), the SerDes interface circuit 3 includes a FIFO (First In First Out) 31 with an output enable (EN), a flip-flop (FF) 32, and an output state machine 33.

The FIFO 31 inputs an input clock (first clock) with a frequency of 160 MHz, a 1-bit signal operating with a clock of 160 MHz (transmission data of 160 MHz: first transmission data), and an output clock (second clock) with a frequency of 180 MHz, fetches the first transmission data with the first clock, and outputs the fetched data in an input order with the second clock when the output enable EN is "1". On the other hand, when the output enable EN is "0", an immediately preceding output is maintained. An output of the FIFO 31 is input to an output state machine 33 as a signal A, and also input to a data terminal of the flip-flop 32. Here, the frequency of the second clock corresponds to an operation clock (180 MHz) of 16-bit parallel data output from the new communication control circuit 1 described with reference to FIG. 1.

The second clock of 180 MHz is input to a clock terminal of the flip-flop 32, the first transmission data from the FIFO 31 is fetched and held by the flip-flop 32 with the second clock, and the held data is output to an output state machine 33 as a signal B. Specifically, the output state machine 33 receives first transmission data (A: FIFO output) from the FIFO 31 at a certain timing, and first transmission data (B: FF output) from the FIFO 31 at a timing before one clock of the second clock than the certain timing. Note that the second clock is input to a clock input terminal of the output state machine 33, and an enable signal (EN) from the output state machine 33 is input to an output enable terminal of the FIFO 31.

For example, the output state machine 33 generates parallel data containing consecutive 18 bits of the same data (containing the same logical value) on the serial data from the signal (A) input to a terminal A and the signal (B) input to a terminal B thereof. Here, in FIG. 3(b), for example, since data "B" in a state "1" is data fetched by the flip-flop 32 at a timing before one clock (180 MHz), the data "B" is the same logical value as the data "A" in a state "0". Therefore, by adding 2-bit parallel data of the data "B" in the state "1" to 16-bit parallel data of the data "A" in the state "0", 16-bit parallel data containing 18-bit same logical value may be generated.

Similarly, by adding 4-bit parallel data of the data "B" in a state "2" to 14-bit parallel data of the data "A" in the state "1", 16-bit parallel data containing 18-bit same logical value may be generated, and further by adding 10-bit parallel data of the data "B" in a state "5" to 8-bit parallel data of the data "A" in a state "4", 16-bit parallel data containing 18-bit same logical value may be generated. In addition, since the EN of a state "7" is "0", the FIFO output is not updated in a state "8", and FIFO output data next to "A" in the state "7" and "B" in the state "8" may be input to "A" in the state "0" and "B" in the state "1".

In this way, for example, a 1-bit signal of 160 MHz from the compatible communication control circuit 2 is processed for 8 bits from the state "0" to the state "8", and these processing may be repeated. FIG. 3(c) depicts an input/output signal and an internal state of the FIFO 31, the FF 32 and the output state machine 33 for each one clock (180 MHz) when data are input to the FIFO 31 depicted in FIG. 3(a) in the order of D0, D1, D2, . . . (where each of D0, D1, D2, . . . is "0" or "1").

As depicted in FIG. 3(c), for example, in the state "8", since "A" does not appear in parallel data of the output state machine 33, it is necessary to stop an update of the output data of the FIFO 31, and the EN is set to "0" in the state "7". Further, although an output "A" of the FIFO 31 in the state "8" and an output "B" of the FF 32 in the state "0" are both D8, and these outputs do not affect the parallel data (that is, since the data update of the FIFO 31 is stopped and the outputs are D8, but the outputs may be possible as "0" or "1". As described above, it will be understood from FIG. 3(c) that 8-bit data is output as parallel data by 18 bits in one set from the state "0" to the state "8".

Here, in the parallel data (16-bit parallel data) generated by the output state machine 33, when assuming a consecutive bit number of the same data corresponding to the first transmission data (1-bit signal of 160 MHz), to V (18 bits), a frequency of the first clock to W (160 MHz), a frequency of the second clock to X (180 MHz), and a bit number of parallel data of the second transmission data operating with the second clock to Y (16 bits), the consecutive bit number of the same data V may be represented by $V=(X \times Y)/W$.

In the above descriptions, when the first transmission data input to the FIFO 31 is a plurality of bits, for example, even when the compatible communication control circuit 2 outputs a plurality of signals of 160 MHz, the same processing may be substantially performed.

Figure 4:
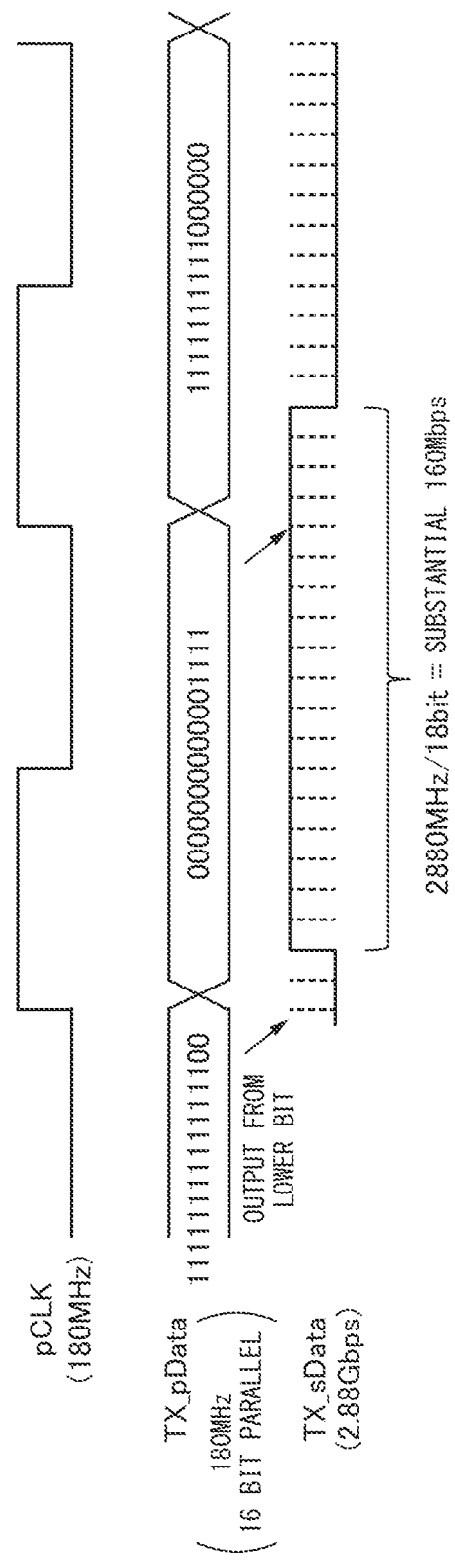
FIG. 4 is a diagram for explaining operations of the SerDes interface circuit depicted in FIG. 3.

FIG. 4 is a diagram for explaining operations of the SerDes interface circuit depicted in FIG. 3. As described above, since the transmission parallel data TX_pData containing consecutive same data such as "111111111111111111" generated by the SerDes interface circuit 3 (output state machine 33) is input to the SerDes 7, so that a substantial communication rate may be lowered.

As depicted in FIG. 4, for example, in the case of transmitting a signal of 160 Mbps at a communication rate of 2.88 Gbps, so as to transmit a 1-bit signal of 160 Mbps (MHz) by using the same SerDes 7 (the same communication rate), the 1-bit signal of 160 Mbps may be converted into parallel data containing consecutive 18-bit same data, and input the converted parallel data to the SerDes 7, since 2.88 G/160 M=18.

As a result, the SerDes interface circuit 3 (output state machine 33) outputs 16-bit parallel data of 180 MHz, wherein data corresponding to 1-bit of 160 Mbps is parallel data containing consecutive 18-bit same logical value, so that data transmission is performed by substantially lowering the communication rate of the transmission serial data TX_sData. Therefore, data transmission of different communication rates (different specifications) may be performed using the same SerDes 7.

Figure 5:
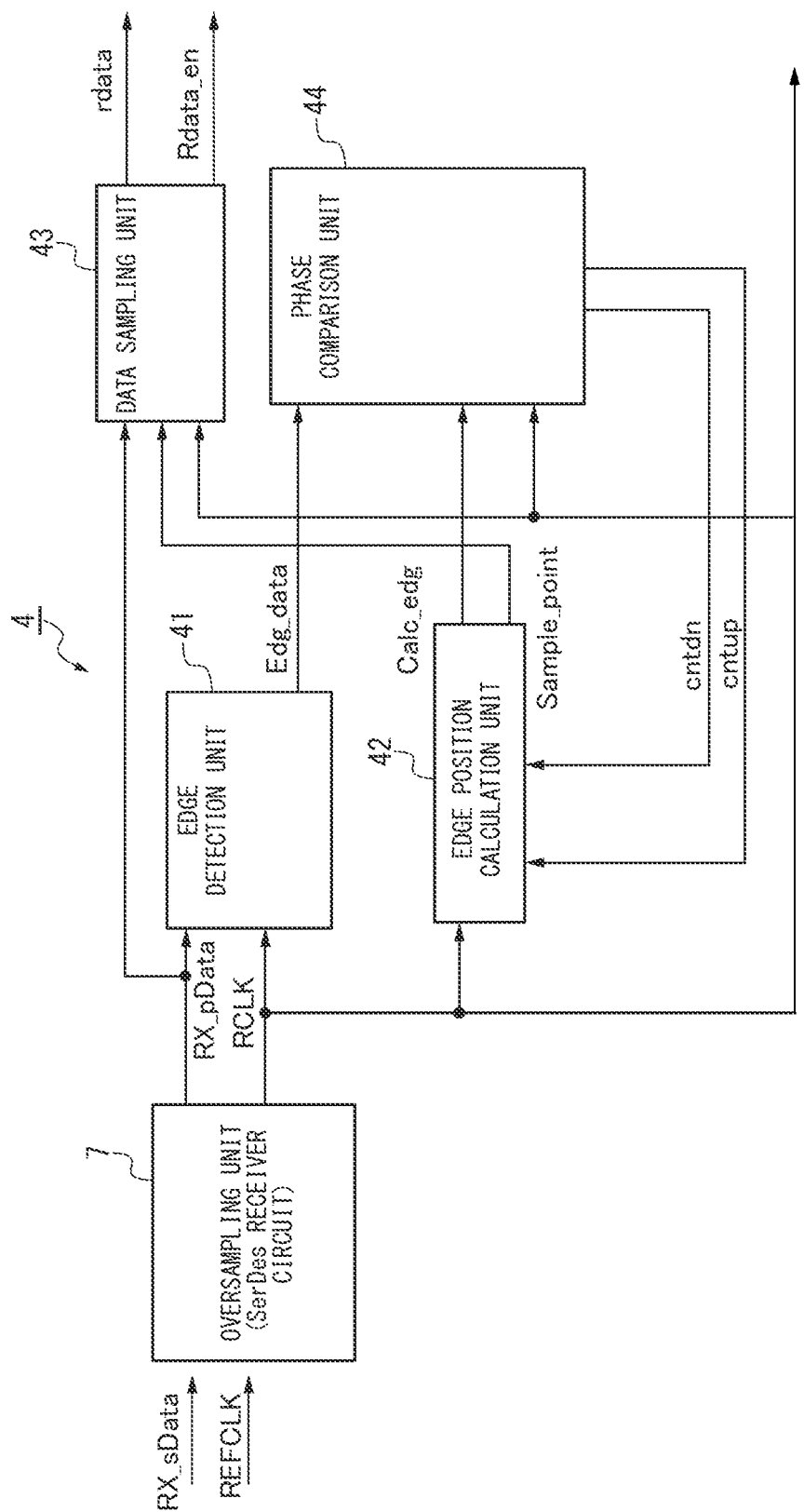
FIG. 5 is a block diagram depicting an example of a data recovery circuit in the control device depicted in FIG. 1.
Figure 6:
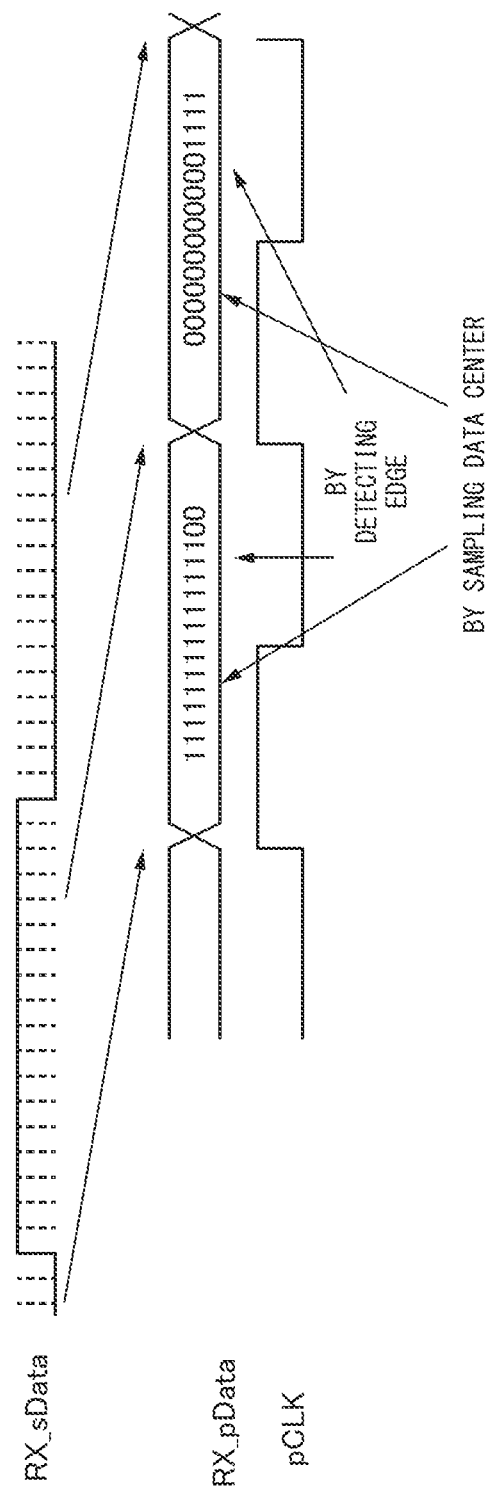
FIG. 6 is a diagram for explaining operations of the data recovery circuit depicted in FIG. 5.

FIG. 5 is a block diagram depicting an example of a data recovery circuit in the control device depicted in FIG. 1, and FIG. 6 is a diagram for explaining operations of the data recovery circuit depicted in FIG. 5. In FIG. 5, a reference sign RX_sData denotes reception serial data, REFCLK denotes a reference clock, RX_pData denotes n-bit reception parallel data, RCLK denotes a recovery clock with a frequency of 1/n of a communication rate, and Edg_data denotes edge position data. Further, a reference sign Calc_edg denotes edge prediction position data, Sample_point denotes sampling position data, cntup denotes a phase control signal for advancing a phase, cntdn denotes a phase control signal for delaying a phase, rdata denotes recovery data, and Rdata_en denotes a data enable signal.

The data recovery (DR) circuit 4 depicted in FIG. 5 corresponds to a data reproduction circuit disclosed in PTL4 described above. As previously described with reference to FIG. 1 and FIG. 2, for example, the SerDes 7 converts reception serial data RX_sData with a communication rate of 2.88 Gbps into 16-bit reception parallel data RX_pData operating with a clock of 180 MHz. Further, as depicted in FIG. 1, the reception parallel data RX_pData converted by the SerDes 7 is input to the DR circuit 4. Note that the DR circuit 4 outputs two bit signals together with a data enable Rdata_en to the bit converter circuit 5, and the bit converter circuit 5 generates a 1-bit signal by the data enable Rdata_en and outputs 1-bit signal of 160 MHz to the compatible communication control circuit 2. That is, the DR circuit 4 and the bit converter circuit 5 constitute a conversion processing circuit which receives the reception parallel data RX_pData converted by the SerDes 7, converts the reception parallel data RX_pData into a signal of the same specifications as the 1-bit signal (first transmission data) of 160 MHz, and outputs it to the compatible communication control circuit 2.

As depicted in FIG. 5, the DR circuit 4 inputs a signal (reception parallel data RX_pData and a recovery clock RCLK) from the oversampling unit (SerDes) 7. The oversampling unit 7 samples serial data (reception serial data) RX_sData received by serial communication by a clock with a frequency higher than a communication rate of the serial data, and outputs n (n is an integer of 2 or more) bits of reception parallel data RX_pData and a recovery clock RCLK with a frequency of 1/n of the sampling clock.

The DR circuit 4 includes an edge detection unit 41, an edge position calculation unit 42, a data sampling unit 43, and a phase comparison unit 44. As depicted in FIG. 6, the edge detection unit 41 detects an edge position of the parallel data, and outputs it as edge data. The edge position calculation unit 42 predicts an edge position of the next parallel data output from the oversampling unit 7 based on a phase control signal from the phase comparison unit 44, outputs it as edge prediction position data, and further outputs data shifting the edge prediction position data by a half phase as sampling position data.

The phase comparison unit 44 compares the edge data output from the edge detection unit 41 with the edge prediction position data output from the edge position calculation unit 42, and outputs a phase control signal (cntup, cntdn). The data sampling unit 43 samples data by the parallel data from the oversampling unit 7 based on the sampling position data from the edge position calculation unit 42. Specifically, as depicted in FIG. 6, the data sampling unit 43 samples a data center of the parallel data from the oversampling unit 7, and outputs the data center as recovery data (reproduction data) together with a data enable Rdata_en indicating a validity of the data.

Further, two bit signals output from the DR circuit 4 are converted, for example, into a 1-bit signal by the data enable Rdata_en by the bit converter circuit 5, and the 1-bit signal of 160 MHz is output from the bit converter circuit 5 to the compatible communication control circuit 2. In this way, the control device 10 may perform data transmission of different communication rates (different specifications) using the same SerDes in both data transmission and data reception. Note that the DR circuit 4 and the bit converter circuit 5 are merely examples, and various changes and modifications may be made, and various known circuits may be applied.

Figure 7:
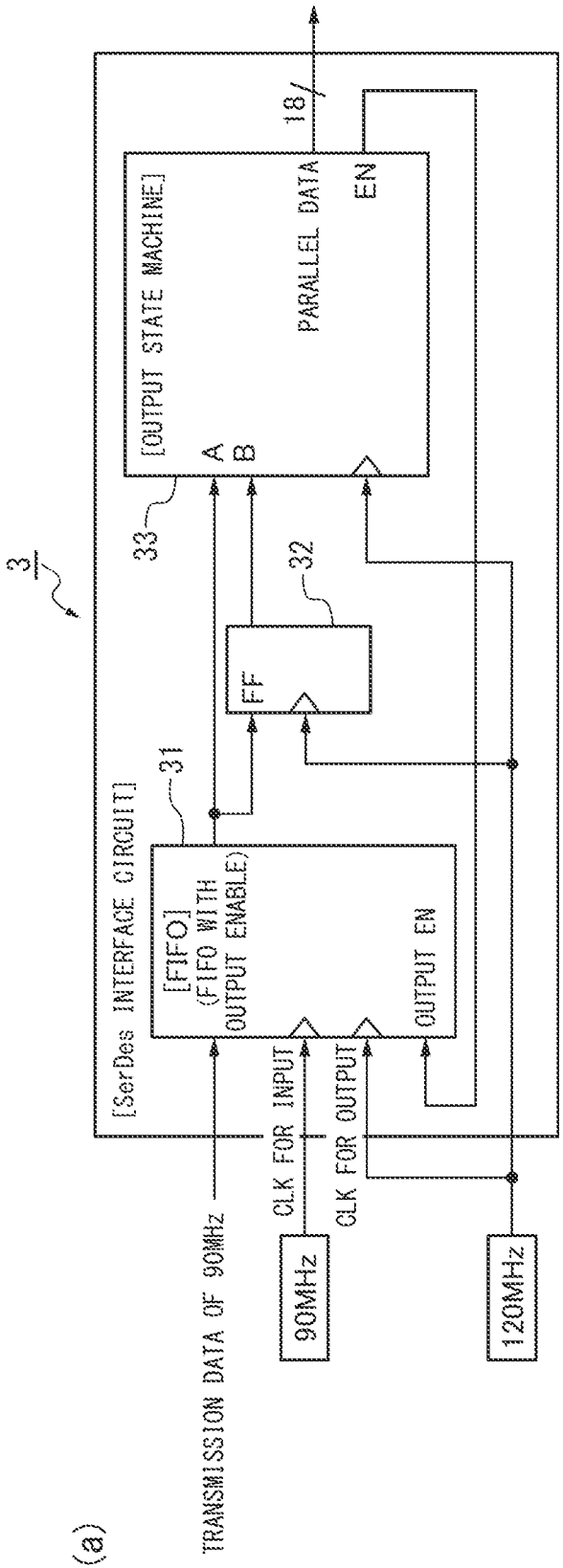
FIG. 7 is a diagram for explaining another application example of the SerDes interface circuit depicted in FIG. 3.

FIG. 7 is a diagram for explaining another application example of the SerDes interface circuit depicted in FIG. 3. Here, FIG. 7(a) is a block diagram depicting another application example of a SerDes interface circuit, and FIG. 7(b) is a diagram for explaining operations of an output state machine in the SerDes interface circuit depicted in FIG. 7(a). Note that the configuration of FIG. 7(a) is substantially the same as that of FIG. 3(a), and the explanations thereof are omitted.

Figure 8:
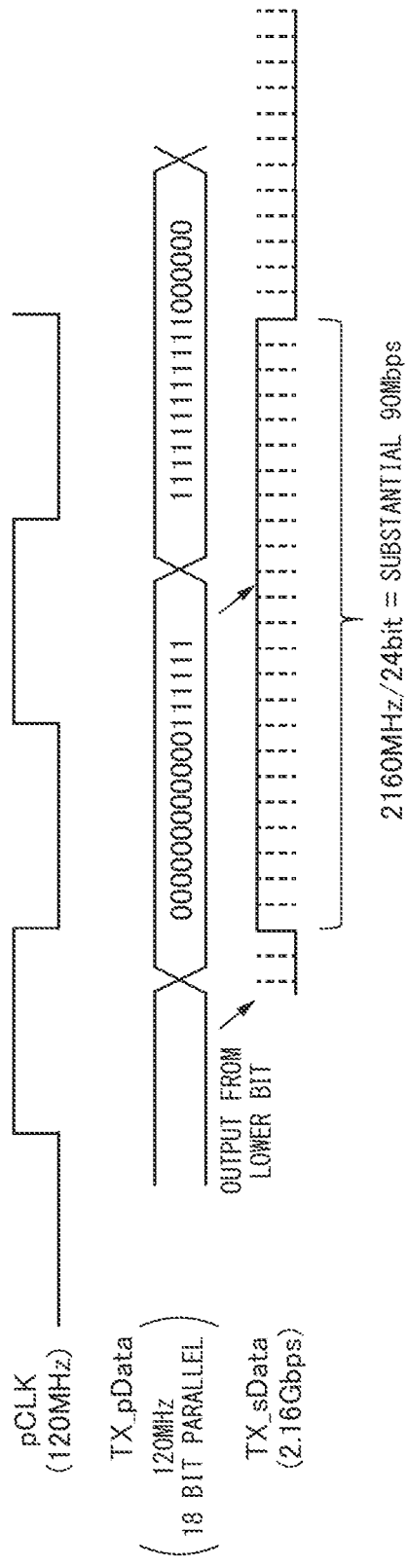
FIG. 8 is a diagram for explaining operations of the SerDes interface circuit depicted in FIG. 7.

FIG. 3 and FIG. 4 depict an application example of the SerDes interface circuit 3 when 16-bit parallel data operating with a clock of 180 MHz and a 1-bit signal operating with a clock of 160 MHz are converted into serial data of 2.88 Gbps via a SerDes 7, and the converted serial data is transmitted to an opposite device 200. On the other hand, FIG. 7 and FIG. 8 depict another application example of the SerDes interface circuit 3 when 18-bit parallel data operating with a clock of 120 MHz and a 1-bit signal operating with a clock of 90 MHz are converted into serial data of 2.16 Gbps via a SerDes 7, and the converted serial data is transmitted to an opposite device 200.

The output state machine 33, for example, generates parallel data containing consecutive 24-bit same data (containing the same logical value) in the serial data, by using a signal (A: FIFO output) input to a terminal A and a signal (B: FF output) input to a terminal B, wherein the signal B is an output of a flip-flop which fetches and holds the signal (A) at a timing before one clock. Note that the signal output from the output state machine 33 (SerDes interface circuit 3) corresponds to parallel data of 18 bits of 120 MHz output from the new communication control circuit 1.

That is, as depicted in FIG. 7(b), the output state machine 33 generates parallel data containing 24-bit same logical value from the signals A and B, for example, data "B" in a state "1" is the same logical value as that of data "A" in a state "0", since the data "B" in the state "1" corresponds to data fetched by the flip-flop 32 at one clock before. Therefore, by adding 6-bit parallel data of the data "B" in the state "1" to the parallel data of 18 bits of the data "A" in the state "0", 18-bit parallel data containing 24 bits of the same logical value may be generated.

Similarly, for example, by adding 12-bit parallel data of a signal "B" in a state "2" to 12-bit parallel data of 12 bits of a signal "A" in the state "1", 18-bit parallel data containing 24 bits of the same logical value may be generated. Note that, since an EN of the state "2" is "0", an output of the FIFO 31 is not updated in a state "3", and output data of the FIFO 31 next to inputting "A" of the state "2" and "B" of the state "3" is input to the "A" of the state "0" and the "B" of the state "1". In this way, for example, the 1-bit signal of 90 MHz output from the compatible communication control circuit 2 are processed for 3 bits from the state "0" to the state "3", and the processing may be repeated.

FIG. 8 is a diagram for explaining operations of the SerDes interface circuit depicted in FIG. 7. As described above, by inputting consecutive same data such as "111111111111111111" generated by the SerDes interface circuit 3 (output state machine 33) as transmission parallel data TX_pData, a substantial communication rate may be lowered.

That is, as depicted in FIG. 8, for example, when a signal of 120 Mbps is transmitted at a communication rate of 2.16 Gbps, for example, so as to transmit a 1-bit signal of 90 Mbps by using the same SerDes 7 (the same communication rate), the 1-bit signal of 90 Mbps may be converted into parallel data containing consecutive 24-bit same data, and input the converted parallel data to the SerDes 7, since 2.16 G/120 M=24.

As a result, the SerDes interface circuit 3 (output state machine 33) outputs 18-bit parallel data of 120 MHz, wherein data corresponding to 1-bit of 90 Mbps is parallel data containing 24-bit same logical value, so that data transmission is performed by substantially lowering the communication rate of the transmission serial data TX_sData. Therefore, data transmission of different communication rates may be performed using the same SerDes 7.

Here, in the parallel data (18-bit parallel data) generated by the output state machine 33, when assuming a consecutive bit number of the same data corresponding to the first transmission data (1-bit signal of 190 MHz) to V (24 bits), a frequency of the first clock to W (90 MHz), a frequency of the second clock to X (120 MHz), and a bit number of parallel data of the second transmission data operating with the second clock to Y (18 bits), the consecutive bit number of the same data V may be represented by V=(X×Y)/W.

Figure 9:
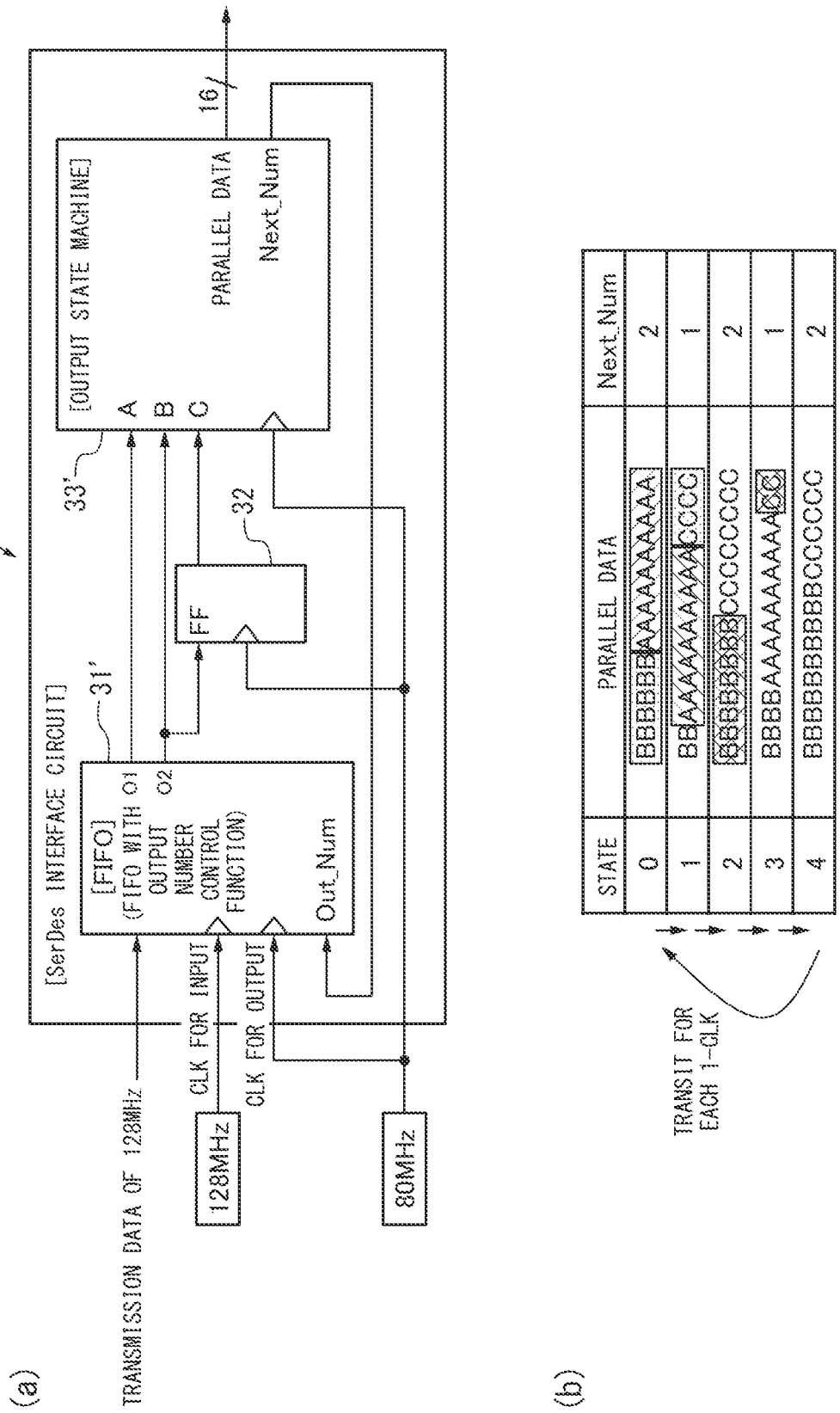
FIG. 9 is a diagram for explaining a modification of the SerDes interface circuit in the control device depicted in FIG. 1.

FIG. 9 is a diagram for explaining a modification of the SerDes interface circuit in the control device depicted in FIG. 1. Here, FIG. 9(a) is a block diagram depicting a modification of a SerDes interface circuit, and FIG. 9(b) is a diagram for explaining operations of an output state machine in the SerDes interface circuit depicted in FIG. 9(a). Note that, as is clear from the comparison FIG. 9(a) with FIG. 3(a) and FIG. 7(a), in the SerDes interface circuit 3 of the present modification, the FIFO 31 with the output enable is modified as a FIFO 31' with an output number control function, and the output state machine 33 is modified as an output state machine 33' suitable for the FIFO 31'. Further, the present modification indicates an example, wherein 16-bit parallel data operating with a clock of 80 MHz and a 1-bit signal operating with a clock of 128 MHz are converted into serial data of 1.28 Gbps by the SerDes 7, and the converted serial data is transmitted to the opposite device.

As depicted in FIG. 9(a), the FIFO 31' inputs an input clock (first clock) with a frequency of 128 MHz, a 1-bit signal based on a clock of 128 MHz (transmission data with an operation frequency of 128 MHz: first transmission data), and an output clock (second clock) with a frequency of 80 MHz, fetches the first transmission data based on the first clock, and sequentially outputs the fetched data with the second clock. Note that an output (first FIFO output) O1 of the FIFO 31' is input to the output state machine 33' as a signal A, and an output (second FIFO output) O2 of the FIFO 31' is input to the output state machine 33' as a signal B and also input to a data terminal of a flip-flop 32.

Further, the FIFO 31' inputs an output number control signal Next_Num output from the output state machine 33' by an output number control terminal Out_Num. In this modified example, when transmitting 16-bit parallel data of 80 MHz and 1-bit signal of 128 MHz via a SerDes 7 with a communication rate of 1.28 Gbps, 1-bit signal of 128 MHz may be converted into parallel data containing the same data of 10 bits, and input the converted parallel data to the SerDes 7, since 1.28 G/128 M=10.

FIG. 10 is a diagram for explaining a FIFO with an output number control function in the SerDes interface circuit depicted in FIG. 9, wherein FIG. 10(a) depicts a case where Out_Num=1, and FIG. 10(b) depicts a case where Out_Num=2.

As depicted in FIG. 10(a), in the case where Out_Num=1, data firstly input and stored (data firstly output: data held in "1" of the FIFO) is output to an output (first FIFO output) O2, and nothing is output to an output (second FIFO output) O1. Next, as depicted in FIG. 10(b), in the case where Out_Num=2, data stored in "1" of the FIFO is output to the output O1, and data stored in "2" of the FIFO (data to be output next to "1") is output to the output O2. This makes it possible to perform data transmission of different communication rates (different specifications) using the same SerDes 7, similarly to the example described with reference to FIG. 3 and FIG. 4 and the example described with reference to FIG. 7 and FIG. 8.

That is, as depicted in FIG. 9(b), the output state machine 33' generates parallel data containing consecutive 10-bit same data as a signal (A: O1) of a terminal A, a signal (B: O2) of a terminal B, and a signal (C: output signal of the flip-flop 32) of a terminal C. Here, in FIG. 9(b), for example, since data "C" in a state "1" is data in which an output O2 is fetched by the flip-flop 32 at a timing before one clock, the data "C" in the state "1" is the same logical value as that of data "B: O2" in a state "0". Therefore, not only parallel data containing consecutive 10-bit same data of the data "A" in the state "0" is generated, but parallel data containing consecutive 10-bit same logical value obtained by adding 4-bit parallel data of the data "C" in the state "1" to 6-bit parallel data of the data "B" in the state "0" is also generated.

This generation of parallel data containing the same logical value of 10 bits may be similarly performed, for example, by adding 2-bit parallel data of data "C" in a state "3" to 8-bit parallel data of data "B" in a state "2". In this way, the same processing may be performed by controlling the outputs O1 and O2 of the FIFO 31' by the output number control signal Next_Num output from the output state machine 33'.

That is, the FIFO 31' outputs only the second FIFO output (O2) without outputting the first FIFO output (O1) by the control signal from the output state machine 33' or outputs the first FIFO output (O1: data of "1") and the second FIFO output (O2) that is the data ("2") to be output in the next order of the first FIFO output. Note that the above-described SerDes interface circuit 3 is merely an example, and various changes and modifications may be possible.

Here, in the parallel data (16-bit parallel data) generated by the output state machine 33', when assuming a consecutive bit number of the same data corresponding to the first transmission data (1-bit signal of 128 MHz) to V (10 bits), a frequency of the first clock to W (128 MHz), a frequency of the second clock to X (80 MHz), and a bit number of parallel data of the second transmission data operating with the second clock to Y (16 bits), the consecutive bit number of the same data V may be represented by V=(X×Y)/W.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST

1 New communication control circuit
2 Compatible communication control circuit
3 SerDes interface circuit
4 Data recovery (DR) circuit
6 Selector
7 SerDes (serializer/deserializer), oversampling unit
10 Control device
31 FIFO (FIFO with output enable)
31' FIFO (FIFO with output number control function)
32 Flip-Flop (FF)
33, 33' Output state machine
41 Edge detection unit
42 Edge position calculation unit 43 Data sampling unit
44 Phase comparison unit
100 Own device (control device)
200 Opposite device

The invention claimed is:

1. A control device for processing transmission data operating with a first clock of a first frequency, the control device comprising:
a SERializer/DESerializer ("SerDes") configured to convert transmission parallel data into serial data of a predetermined communication rate by a second clock of a second frequency different form the first frequency;
a SerDes interface circuit configured to input the transmission data, convert and output Y-bit parallel data containing consecutive same data corresponding to the transmission data;
wherein the SerDes interface circuit comprises:
a First in First Out ("FIFO") configured to input the first clock, the transmission data operating with the first clock and the second clock, and configured to output the transmission data by the second clock in an input order based on a control signal output from an output state machine;
a flip-flop configured to fetch and hold an output of the FIFO by the second clock; and
the output state machine being configured to input the output of the FIFO and an output of the flip-flop, and configured to generate parallel data containing consecutive bits of same logical value data corresponding to the transmission data by the second clock.

2. The control device according to claim 1, wherein the output state machine is configured to output parallel data containing consecutive V-bits of the same logical value data by the second clock determined by a following equation:

$$V=(X \times Y)/W$$

wherein,
V denotes a consecutive bit number, in which the same data corresponding to the transmission data is consecutive,
W denotes a frequency of the first clock,
X denotes a frequency of the second clock, and
Y denotes a bit number of transmission parallel data operating with the second clock, in parallel data generated by the output state machine.

3. The control device according to claim 2, wherein a bit number of the parallel data generated by the output state machine is the same as the bit number Y of the transmission parallel data.

4. The control device according to claim 2, wherein the output state machine is configured to input a FIFO output from the FIFO and a Flip-Flop ("FF") output from the flip-flop which fetches the FIFO output from the FIFO one clock before by the second clock, and configured to generate the parallel data containing the consecutive V-bit same data.

5. The control device according to claim 4, wherein the FIFO is enable-controlled by a control signal output from the output state machine.

6. The control device according to claim 2, wherein the output state machine is configured to input a first FIFO output and a second FIFO output from the FIFO and an FF output from the flip-flop which fetches the second FIFO output one clock before by the second clock, and configured to generate the parallel data containing the consecutive V-bit same data based on the first FIFO output, the second FIFO output and the FF output.

7. The control device according to claim 6, wherein the FIFO is controlled by a control signal output from the output state machine whether
the FIFO is configured to only output the second FIFO output without outputting the first FIFO output, or
the FIFO is configured to output the first FIFO output, and the second FIFO output that is the data to be output in the next order of the first FIFO output.

8. The control device according to claim 1,
further comprising a selector configured to select one of the transmission data or an output of the SerDes interface circuit, and configured to output to the SerDes.

9. The control device according to claim 1, wherein the predetermined communication rate Z is represented by $$Z=X \times Y$$

wherein,
X denotes a frequency of the second clock, and
Z denotes a predetermined communication rate of the serial date which is converted by the SerDes.

10. The control device according to claim 1, wherein the SerDes is configured to include a function of converting reception serial data with a predetermined communication rate into reception parallel data, and
the control device further comprises a data recovery ("DR") circuit configured to input the reception parallel data converted by the SerDes, and a bit converter circuit configured to convert the reception parallel data into a signal of the same specifications as those of the transmission data.

11. The control device according to claim 1, wherein the control device is configured to perform data transmission by serial data between the control device and an opposite device, and wherein
the opposite device is configured to be controlled by the serial data from the control device.

12. The control device according to claim 11, wherein the control device is a Computerized Numerical Controller ("CNC"), and
the opposite device is a machine tool controlled by the CNC.

13. The control device according to claim 11, wherein the control device is a robot controller, and
the opposite device is an industrial robot or a collaborative robot controlled by the robot controller.

* * * * *